United States Patent [19]
Kawano

[11] Patent Number: 6,104,329
[45] Date of Patent: Aug. 15, 2000

[54] FLOATING TYPE ANALOG-TO-DIGITAL CONVERTER USING DELAY UNITS TO ACHIEVE A WIDE DYNAMIC RANGE

[75] Inventor: Toshihiko Kawano, Tokushima-ken, Japan

[73] Assignee: Yamaha Corporation, Hamamatsu, Japan

[21] Appl. No.: 09/098,160

[22] Filed: Jun. 16, 1998

[30] Foreign Application Priority Data

Jun. 24, 1997 [JP] Japan .................................. 9-167769

[51] Int. Cl.[7] .............................. H03M 1/62; H03M 1/06
[52] U.S. Cl. .......................................... 341/139; 341/118
[58] Field of Search .................................. 341/139, 172, 341/143, 155, 118, 141; 370/215, 290; 348/466, 614; 704/229

[56] References Cited

U.S. PATENT DOCUMENTS

| | | | |
|---|---|---|---|
| 5,241,310 | 8/1993 | Tiemann | 341/143 |
| 5,561,660 | 10/1996 | Kotowski et al. | 370/215 |
| 5,896,101 | 4/1999 | Melanson | 341/143 |

FOREIGN PATENT DOCUMENTS 65819  1/1994  Japan .

*Primary Examiner*—Brian Young
*Assistant Examiner*—Patrick Wamsley
*Attorney, Agent, or Firm*—Pillsbury Madison & Sutro LLP

[57] ABSTRACT

A floating type analog-to-digital converter which is capable of converting an analog signal into a digital signal in a wide dynamic range, while exhibiting stable frequency characteristics due to the presence of symmetric pre-echo and post-echo in the impulse response waveform. An analog signal level adjusting device adjusts the level of an analog signal with different first gains, so as to generate a plurality of analog signals of different levels for analog-to-digital conversion. A plurality of analog-to-digital converters convert respective ones of the plurality of analog signals generated from the analog signal level adjusting device, into respective digital signals, and output the digital signals. A digital signal level adjusting device adjusts the levels of the digital signals with different second gains corresponding to respective inverses of the first gains, and generates the adjusted digital signals, which are then delayed and generated by a delay device. A switching device selects one of the digital signals generated from the delay device, based on the level of one digital signal selected from the digital signals generated from the plurality of analog-to-digital converters, and generates the selected one digital signal.

9 Claims, 11 Drawing Sheets

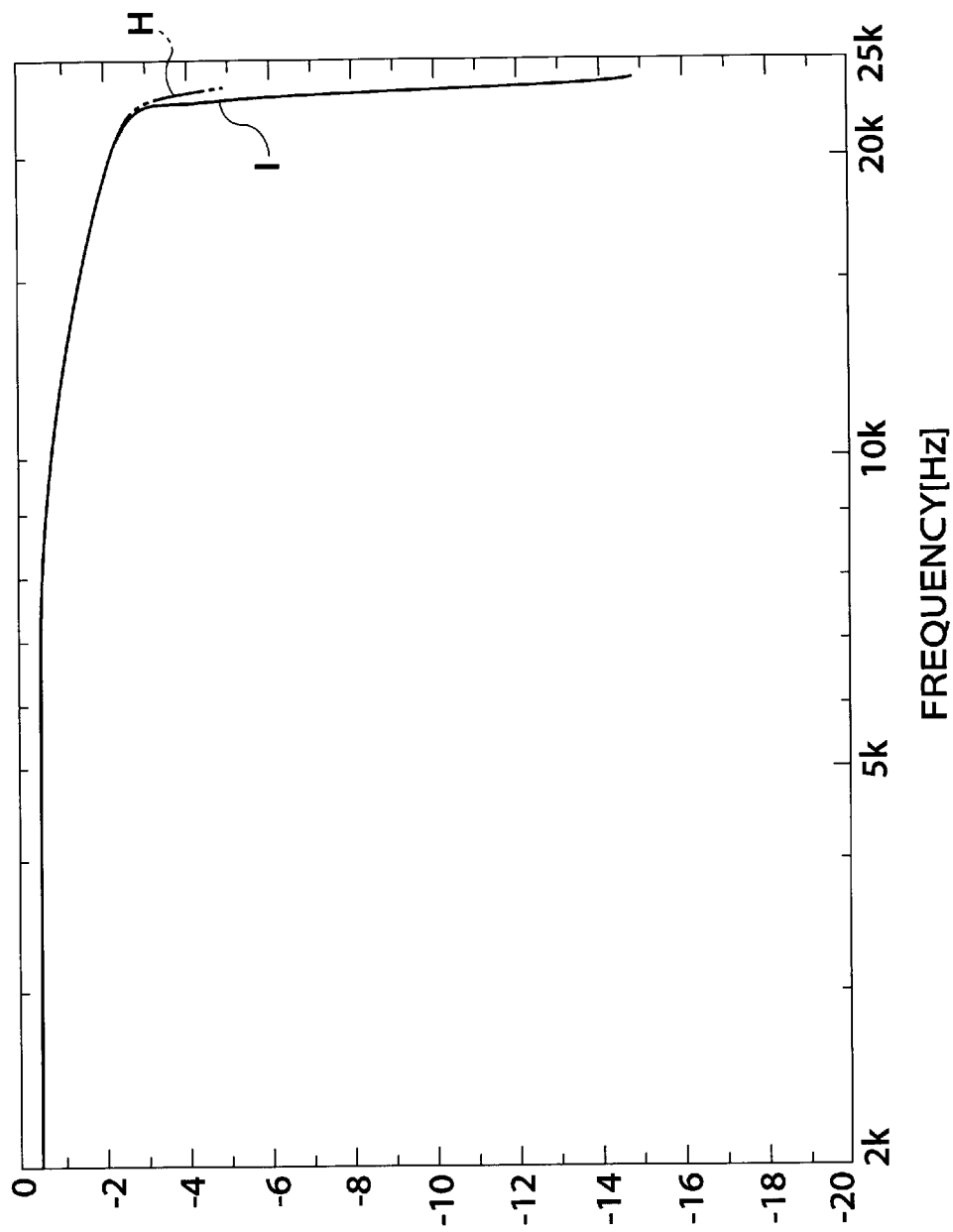

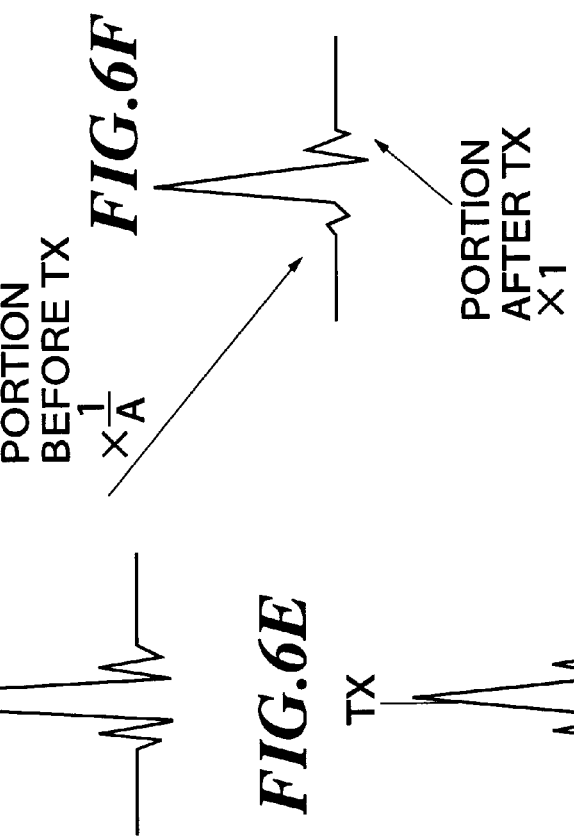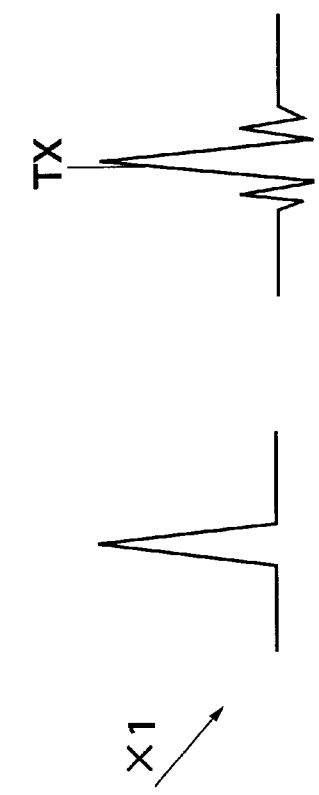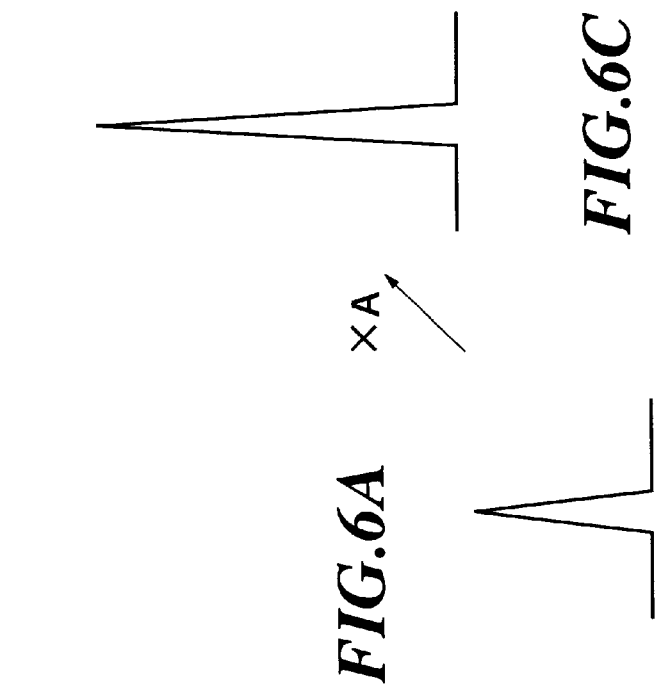

FLOATING TYPE ANALOG-TO-DIGITAL CONVERTER USING DELAY UNITS TO ACHIEVE A WIDE DYNAMIC RANGE

BACKGROUND OF THE INVENTION

1. Field of the Invention

The present invention relates to floating type analog-to-digital converters capable of converting an analog signal to a digital signal in a wide dynamic range.

2. Description of the Related Art

FIG. 1 shows an example of a conventional floating type analog-to-digital converter (herein after referred to as "A/D converter"). As shown in FIG. 1, the floating type A/D converter includes two A/D converters 21, 22, and amplifiers 11, 12 are provided on the input sides of the respective A/D converters 21, 22, for amplifying an analog signal to be converted. The amplifier 11 has a predetermined gain A (A>1), and the amplifier 12 has a gain that is equal to 1. With this arrangement, the A/D converter 21 receives an analog signal obtained by amplifying the analog signal to be converted by an amplification factor of A, and the A/D converter 22 receives the analog signal to be converted with its level being maintained.

The A/D converters 21 and 22 have the same structure, and each of these converters 21, 22 includes a ΔΣ modulator 101, and a decimation filter 102. The ΔΣ modulator 101 performs ΔΣ modulation on the analog signal supplied from the amplifier 11, 12, and generates or outputs bit stream data as a result of PDM (Pulse Density Modulation) in which the analog signal is equivalently modulated depending upon its level. The bit stream data is generated from the ΔΣ modulator 101 at a bit rate that is N times (for example, 64 times) the sampling frequency fs of the digital signal to be finally generated from this floating type A/D converter. The decimation filter 102 converts bit stream data generated from this ΔΣ modulator 101, into a multiple-bit digital signal, while performing a subsampling operation thereon, and outputs the digital signal that corresponds to the sampling frequency fs.

As explained above, the A/D converter 22 receives the analog signal to be converted with its level being maintained or unchanged. As a result, the A/D converter 22 generates a digital signal that corresponds to the original analog signal. On the other hand, the A/D converter 21 receives an analog signal obtained by amplifying the original analog signal by an amplification factor of A. As a result, the A/D converter 21 generates a digital signal of a level that is A times that of the original analog signal, as long as the output digital signal is not clipped (saturated). In view of this, a digital signal processing device (DSP) 3 is provided on the output side of the A/D converter 21. The digital signal generated from the A/D converter 21 is multiplied by 1/A by means of this DSP 3, to thereby be modified into a digital signal that corresponds to the level of the original analog signal.

A switching detector 4 and a switching device 5 are provided, which serve to select one of the output signals of the DSP 3 and A/D converter 22, and generate the selected signal. Namely, the switching device 5 causes the switching detector 4 to monitor the output signal of each of the A/D converters 21, 22, and selects and generates the output signal of the DSP 3 when the output signal of the A/D converter 21 is not clipped, or selects and generates the output signal of the A/D converter 22 when the output signal of the A/D converter 21 is clipped.

In the arrangement as explained above, when the analog signal initially applied to the floating type A/D converter is weak, or has a low level or small amplitude, and the output signal of the A/D converter 21 is not clipped (or saturated), the amplifier 11, A/D converter 21 and the DSP 3 are used for performing A/D conversion with a resolution that is A times the inherent resolution of the A/D converter 21, so that the switching device 5 generates a digital signal obtained as a result of the high-resolution A/D conversion.

If the original analog signal has an increased level, and the A/D converter 21 receives this analog signal having an excessively high level or large amplitude, the output signal of the A/D converter 21 is clipped, whereby the output signal of the DSP 3 is also clipped. In this case, the switching device 5 outputs a digital signal into which the original analog signal was converted with the inherent resolution of the A/D converter 22.

Thus, the same analog signal is subjected to high-resolution A/D conversion and normal-resolution A/D conversion at the same time, and the high-resolution A/D conversion is automatically selected and the digital signal as a result of this conversion is generated when the original analog signal has a low level or small amplitude, while the normal-resolution A/D conversion is automatically selected and the digital signal as a result of this conversion is generated when the analog signal has a high level or large amplitude, thus enabling the A/D converter to perform A/D conversion in a wide dynamic range.

As explained above, the floating type A/D converter is capable of converting an analog signal into a digital signal in a wide dynamic range. However, the inventor of the present invention found in his studies that this floating type A/D converter has unstable frequency characteristics in a high frequency range. Details of this problem will be described below.

In an experiment, the inventor applied two impulses having the same waveform to the floating type A/D converter at different times, and obtained sample data of each impulse response waveform generated from the floating type A/D converter. In FIG. 2, plots or points "X" represent sample data of each impulse response waveform taken from the floating type A/D converter, and solid line B and dashed line C represent impulse response waveforms formed by connecting adjacent ones of the plots corresponding to each impulse. Although the impulse response waveform C lacks a peak as noted in FIG. 2, this is because sampling timing of the sample data is shifted from a peak point of the impulse response, and does not mean that the original impulse response waveform does not have a peak.

Then, the impulse response waveforms B and C thus obtained were processed according to FFT (fast Fourier transform), and a frequency characteristic of the gain of the floating type A/D converter was derived from each of the impulse response waveforms B and C. In FIG. 3, D represents a frequency characteristic derived from the impulse response waveform B, and E represents a frequency characteristic derived from the impulse response waveform C. When comparing the frequency characteristics D and E with each other, it is found that these characteristics greatly differ in a high frequency range.

The frequency characteristics D and E were measured at different times, but using impulses having the same waveform. Accordingly, these frequency characteristics D and E should be identical with each other. However, a high-frequency portion of the frequency characteristic derived from the impulse response waveform changes with a slight shift or change of the input timing of the impulse. Thus, the floating type A/D converter has an unstable frequency characteristic in a high-frequency region, as stated above.

The inventor of the present invention made repeated attempts to find out the reason why the frequency characteristic is unstable and unrepeatable in a high-frequency region, based on various hypotheses, but it was extremely difficult to find the reason. Then, the inventor conducted the same experiment as described above, using a successive approximation type A/D converter, rather than the floating type A/D converter. The result of this experiment revealed a cause of occurrence of the unstable, unrepeatable frequency characteristic in a high-frequency region in the floating type A/D converter. This will be described in greater detail below.

Referring to FIG. 4, impulse response waveforms F and G shown in this figure were obtained by applying impulses to the successive approximation type A/D converter at different times, in the same manner as described above. In FIG. 5, frequency characteristics H and I were obtained by processing sample data of the respective impulse waveforms F and G according to FFT (fast Fourier transform). It is apparent from FIG. 5 that the frequency characteristics H and I are approximate or very close to each other. Namely, the successive approximation type A/D converter does not suffer from the problem of unstable frequency characteristic in a high-frequency region, which occurs only in the floating type A/D converter.

Since the frequency characteristics of the successive approximation type A/D converter are different from those of the floating type A/D converter as indicated above, there must be any difference in the impulse response waveforms between these two types of converters. Under this assumption, the present inventor superimposed the impulse response waveforms (FIG. 2) obtained from the floating type A/D converter on the impulse response waveforms (FIG. 4) obtained from the successive approximation type A/D converter, and found that there was a significant difference between the corresponding impulse response waveforms obtained from these A/D converters. Namely, while each impulse waveform has the form in which pre-echo and post-echo are added to the leading and trailing ends, respectively, of a portion of the waveform that corresponds to the original impulse, the ratio of the amplitude of the pre-echo to that of the post-echo which appear in the floating type A/D converter is different from that which appear in the successive approximation type A/D converter.

In the case of the successive approximation type A/D converter, the amplitude of the pre-echo that precedes a peak portion of the waveform is not so different from that of the post-echo that follows the peak portion, as shown in FIG. 4. In the case of the floating type A/D converter, on the other hand, the amplitude of the pre-echo is significantly smaller than that of the post-echo, and the signal pattern of the pre-echo is asymmetrical with that of the post-echo, as shown in FIG. 2.

Between the impulse response waveforms of the floating type A/D converter and those of the successive approximation type A/D converter, there cannot be found any other characteristic difference than the difference as to whether the pattern of the pre-echoes is symmetrical or asymmetrical with respect to that of the post-echo. It may be therefore considered that the reason why the asymmetric pre-echo and post-echo patterns appear in the floating type A/D converter is related to the reason why the frequency characteristic of this type of A/D converter become unstable in a high-frequency region.

It will be now considered why the pre-echo and the post-echo have an asymmetric relationship in the floating type A/D converter. In the floating type A/D converter, the pre-echo and the post-echo are supposed to occur in the decimation filter as shown in FIG. 1. Since this decimation filter consists of a FIR filter having a linear phase characteristic, symmetric pre-echo and post-echo should be added to the input impulse. In the actual floating type A/D converter, however, the pre-echo and post-echo patterns of the impulse response waveform have an asymmetric relationship, as described above. The inventor of the present invention assumed that this asymmetry between the pre-echo and the post-echo may be caused by switching between the high-resolution A/D conversion and the normal-resolution A/D conversion as described above.

Referring to FIGS. 6A–6F and FIG. 1, the cause of the asymmetric relationship between the pre-echo and the post-echo according to the inventor's assumption will be now explained. Suppose an impulse as illustrated in FIG. 6A is applied to the floating type A/D converter constructed as shown in FIG. 1. In this case, an impulse of a level that is A times the level of the applied impulse is supplied to the A/D converter 21, as shown in FIG. 6B, while the applied impulse is supplied as it is to the A/D converter 22 with its level being maintained.

These impulses of FIG. 6A and 6B are converted by the respective A/D converters 21 and 22, into corresponding digital signals. In this A/D conversion, sample data of impulse response waveforms as illustrated in FIGS. 6D and 6E are generated from the respective decimation filters of the A/D converters 21 and 22. As shown in FIGS. 6D and 6E, symmetric pre-echo and post-echo are added to each of the impulse response waveforms that occur in the A/D converters.

In the meantime, the level of the output digital signal of each of the A/D converters 21 and 22 is limited to that which is equal to or lower than the maximum value (clipping level) that is determined depending upon a bit width of the corresponding converter. In the example of FIG. 6, the digital signal generated from the decimation filter of the A/D converter 21 exceeds a clip level at a point of time TX, as shown in FIG. 6D, and therefore the output digital signal of the A/D converter 21 is clipped at and after this point of time TX.

Accordingly, the switching device 5 selects the digital signal whose level is controlled by the DSP 3 to be 1/A times that of the output digital signal of the A/D converter 21, during a period before the point of time TX, and selects the output digital signal of the A/D converter 22 during a period after the point of time TX. As a result, the impulse response waveform generated from the switching device 5 has the form as shown in FIG. 6F, in which a portion of the impulse response waveform obtained from the DSP 3 which corresponds to the pre-echo or precedes the time TX is connected with a portion of the impulse response waveform obtained from the A/D converter 22 which follows the pre-echo or follows the time TX. In this case, the portion of the impulse response waveform (FIG. 6E) generated from the A/D converter 22 which corresponds to the post-echo is generated from the switching device 5 while maintaining its level, whereas the portion of the impulse response waveform generated from the DSP 3 which corresponds to the pre-echo has its level reduced by 1/A, and is thus generated from the switching device 5. As a result, the impulse response waveform generated from the switching device 5 takes the form as illustrated in FIG. 6F, in which the magnitude of the pre-echo is reduced as compared with that of the post-echo, and the pre-echo and post-echo included in the impulse response waveform are asymmetrical with each other. Thus, the asymmetry of the pre-echo and post-echo patterns occurs in the floating type A/D converter, according to the inventor's analysis.

In the known floating type A/D converter, it may be considered that its frequency characteristics become unstable in a high-frequency region because discontinuity or non-uniformity occurs between the portion of the impulse response waveform corresponding to the pre-echo, and the portion of the waveform that follows the pre-echo, for the reason as described above.

SUMMARY OF THE INVENTION

It is therefore an object of the invention to provide a floating type analog-to-digital converter, which is capable of converting an analog signal into a digital signal in a wide dynamic range, which converter exhibits stable frequency characteristics due to the presence of symmetric pre-echo and post-echo in the impulse response waveform.

To attain the above object, the present invention provides a floating type analog-to-digital converter comprising an analog signal level adjusting device that adjusts a level of an analog signal with a plurality of different first gains, so as to generate a plurality of analog signals of different levels for analog-to-digital conversion, a plurality of analog-to-digital converters that convert respective ones of the plurality of analog signals generated from the analog signal level adjusting device, into respective digital signals, and output the digital signals, a digital signal level adjusting device that adjusts levels of the digital signals with a plurality of different second gains corresponding to respective inverses of the plurality of first gains, and generates the adjusted digital signals, a delay device that delays the digital signals generated from the digital signal level adjusting device, and generates the delayed digital signals, and a switching device that selects one of the digital signals generated from the delay device, based on a level of one digital signal selected from the digital signals generated from the plurality of analog-to-digital converters, and generates the selected one digital signal.

Preferably, each of the plurality of analog-to-digital converters comprises a filter having a delay time, and wherein the delay device delays each of the digital signals generated from the digital signal level adjusting device by at least a time period which is equivalent to the delay time of the filter of a corresponding one of the analog-to-digital converters.

Advantageously, the switching device selects the one of the digital signals generated from the delay device, depending upon whether the one digital signal selected from the digital signals generated from the plurality of analog-to-digital converters is clipped.

In a preferred form of the invention, each of the plurality of analog-to-digital converters comprises a ΔΣ modulator and a decimation filter having a delay time, and wherein the delay device delays each of the digital signals generated from the digital signal level adjusting device by at least a time period which is equivalent to the delay time of the decimation filter of a corresponding one of the analog-to-digital converters.

Preferably, the floating type analog-to-digital converter according to the invention further comprises a bypass device that bypasses the delay device, and supplies the digital signals generated from the digital signal level adjusting device to the switching device without passing through the delay device.

In a preferred form of the invention, the digital signal level adjusting device comprises at least one digital signal processing device or at least one multiplier.

The above and other objects, features, and advantages of the invention will become more apparent from the following detailed description taken in conjunction with the accompanying drawings.

BRIEF DESCRIPTION OF THE DRAWINGS

FIG. 5 is a view showing frequency characteristics of the successive approximation type A/D converter, which are obtained by processing the impulse response waveforms of FIG. 4 according to FFT;

FIG. 6A through FIG. 6F are views useful in explaining the cause of asymmetry of pre-echo and post-echo of the impulse response waveform obtained in the known floating type A/D converter, wherein FIG. 6A is a view showing an impulse applied to the floating type A/D converter of FIG. 1;

FIG. 6B is a view showing an impulse which is applied to the A/D converter 21 of FIG. 1, and whose level is A times that of the impulse of FIG. 6A;

FIG. 6C is a view showing an impulse which is applied to the A/D converter 22 of FIG. 1 while maintaining its original level;

FIG. 6D is a view showing an impulse response waveform of sample data generated from the A/D converter 21;

FIG. 6E is a view showing an impulse response waveform of sample data generated from the A/D converter 22; and FIG. 6F is a view showing an impulse response waveform of a digital signal generated from the switching device 5 of FIG. 1;

DETAILED DESCRIPTION OF THE PREFERRED EMBODIMENTS

The invention will be described in detail with reference to the drawings showing preferred embodiments thereof.

Figure 7:
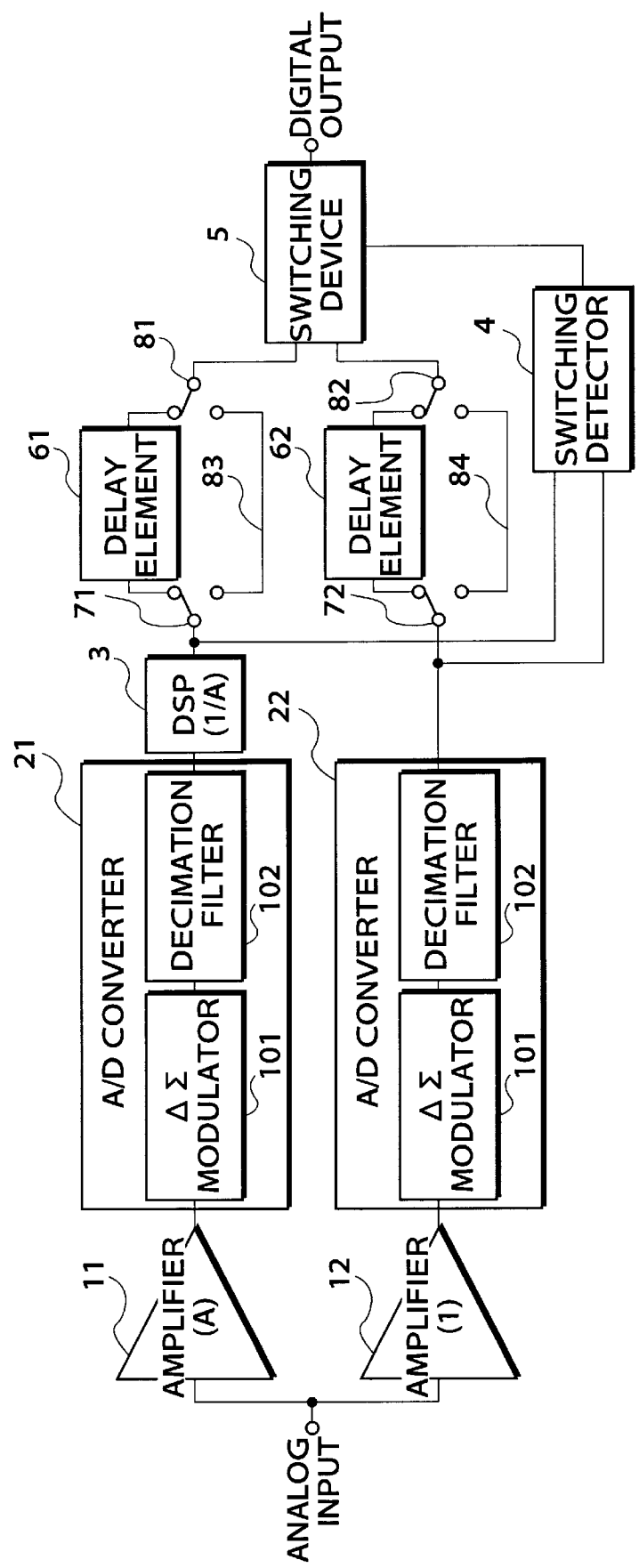
FIG. 7 is a block diagram showing the construction of a floating type A/D converter according to one embodiment of the present invention.

FIG. 7 shows the construction of a floating type A/D converter according to one embodiment of the present invention. In FIG. 7, corresponding elements and parts to those in FIG. 1, referred to above, are designated by identical reference numerals, of which description is omitted.

As shown in FIG. 7, a switch 71, a delay element 61, and a switch 81 are inserted between a DSP 3 and a switching device 5, and a switch 72, a delay element 62, and a switch 82 are inserted between an A/D converter 22 and the switching device 5. Each of the switches 71, 81, 72, 82 provided on the input and output sides of the respective delay elements 61, 62 consists of a switch that can be manually placed in a selected position. Each of the delay elements 61 and 62 consists of a shift register or RAM, and has the same delay time as each decimation filter 102, 102. When the switches 71, 81, 72 and 82 are placed in the state as shown in FIG. 7, digital signals generated from the DSP 3 and A/D converter 22 are delayed by the delay elements 61, 62, respectively, and supplied to the switching device 5.

A switching detector 4 is adapted to monitor digital signals generated from the DSP 3 and A/D converter 22. While the detector 4 detects clipping of an output signal of the A/D converter 21, rather than an output signal of the DSP 3 in the arrangement of FIG. 1 as described above, it does not make a difference which output signal of the DSP 3 and A/D converter 21 is used for detection of clipping, since detection of clipping of the output signal of the A/D converter 21 can be accomplished in either fashion.

Figure 1:
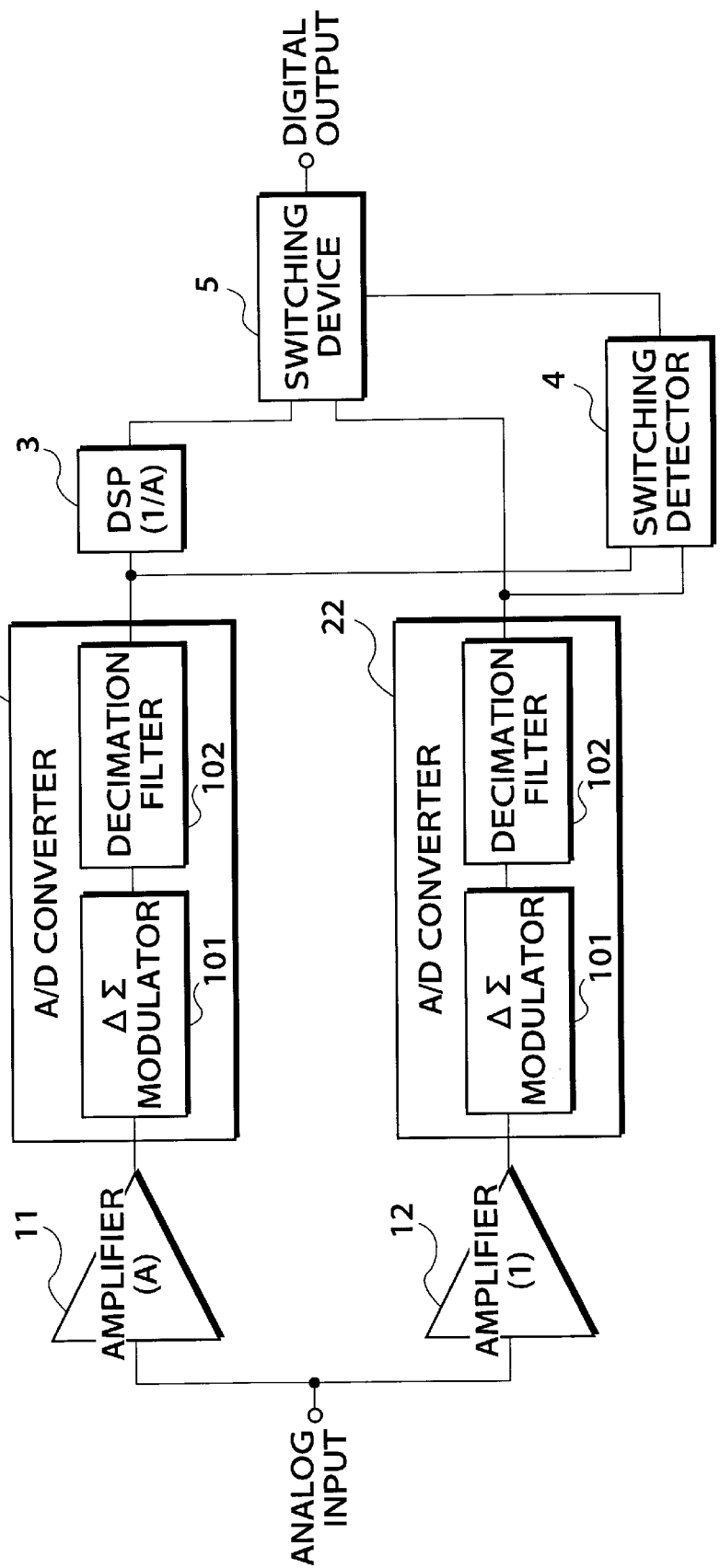
FIG. 1 is a block diagram showing the construction of a conventional floating type A/D converter.
Figure 2:
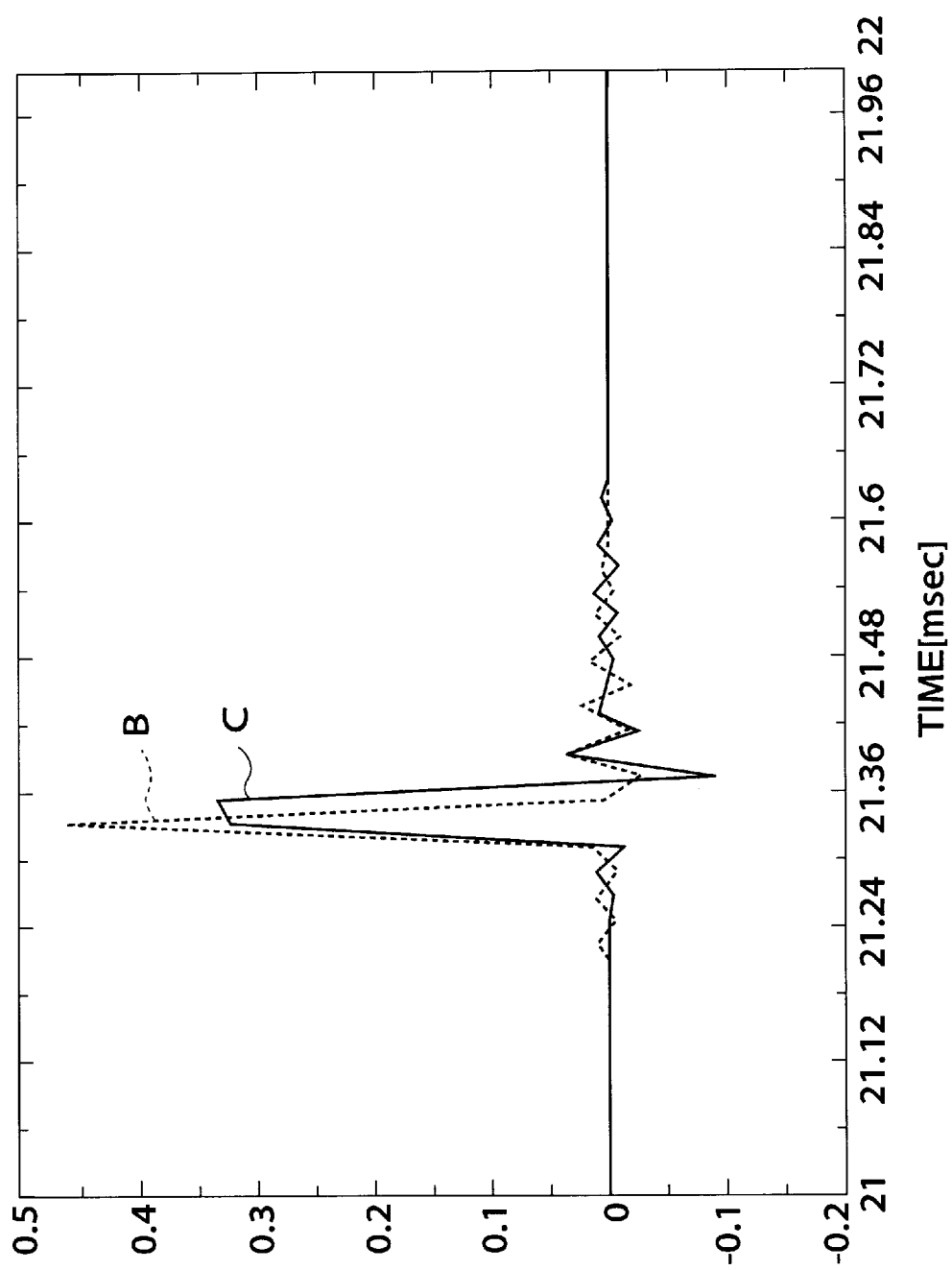
FIG. 2 is a view showing two impulse response waveforms taken from the floating type A/D converter of FIG. 1.
Figure 3:
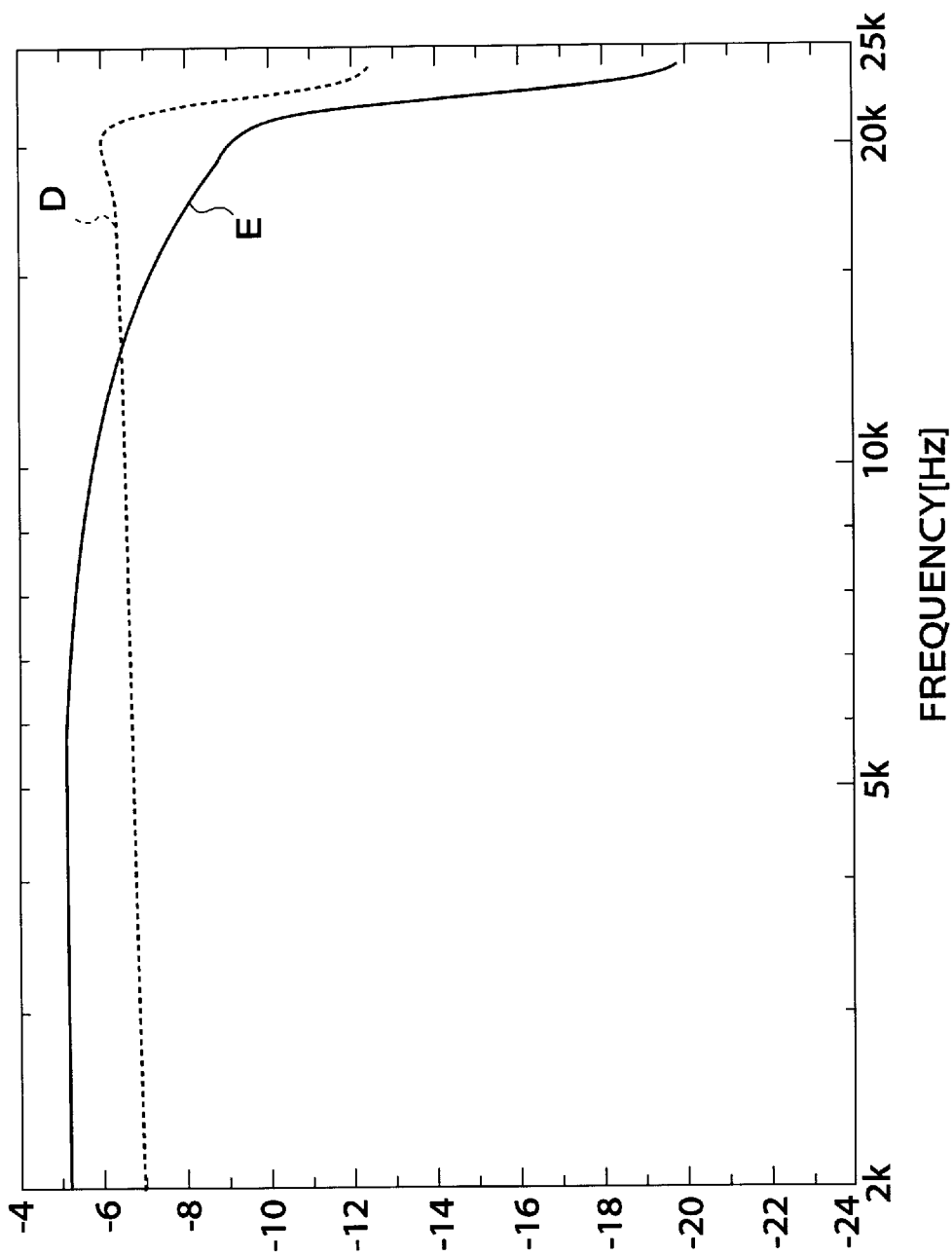
FIG. 3 is a view showing frequency characteristics of the floating type A/D converter, which are obtained by processing the impulse response waveforms of FIG. 2 according to FFT.
Figure 4:
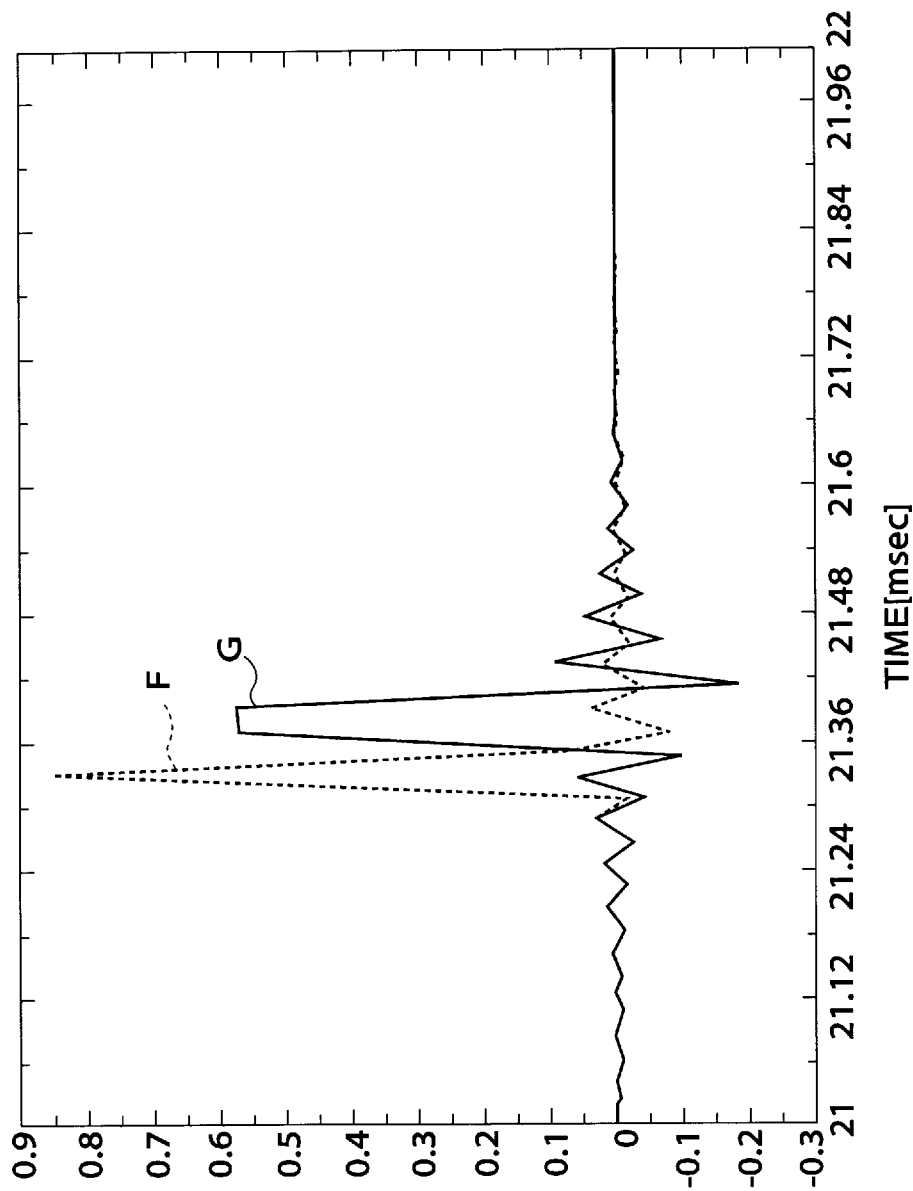
FIG. 4 is a view showing two impulse waveforms taken from a successive approximation type A/D converter.

As in the arrangement of FIG. 1, the switch device 5 is switched based on a result of monitoring by the switching detector 4. More specifically, while the output signal of the DSP 3 is in a non-clipped state, the digital signal supplied from the DSP 3 to the switching device 5 via the delay device 61 is selected and generated. Once the output signal of the DSP 3 is clipped, and the clipping is detected by the switching detector 4, the switching device 5 is switched, and the digital signal supplied from the A/D converter 22 via the delay element 62 is generated by the switching device 5.

The digital signal which is supplied from the delay element 62 to the switching device 5 at a switching time of the switching device 5 is an output digital signal of the A/D converter 22 generated at a point of time which is prior to the above switching time by the delay time of the delay element 62. The delay time of the delay element 62 is equal to the delay time of the decimation filter 102. Accordingly, the floating type A/D converter of the present embodiment does not suffer from the problem of asymmetry between a pre-echo pattern and a post-echo pattern, which problem arises in the known floating type A/D converter.

This will be described in detail referring to FIG. 6A through FIG. 6F. In the floating type A/D converter, each of output signals of the DSP 3 and A/D converter 22 is directly supplied to the switching device 5, and therefore the switching device 5 outputs a non-continuous impulse response waveform formed by combining a portion of an impulse response waveform of the A/D converter 21 which precedes the switching timing TX, and a portion of an impulse response waveform of the A/D converter 22 which follows the switching timing TX.

In the present embodiment, on the other hand, the respective output signals of the DSP 3 and A/D converter 22 are delayed by the corresponding delay elements 61, 62, and supplied to the switching device 5. After the switching timing TX of the switching device 5, therefore, the impulse response waveform generated from the A/D converter 22 which contains the pre-echo is supplied to the switching device 5 via the delay element 62. As a result, the impulse response waveform containing symmetric pre-echo and post-echo can be obtained in the present embodiment.

To confirm the effect of the present invention, the inventor conducted an experiment as follows.

Initially, an impulse was applied to the floating type A/D converter of FIG. 7, and sample data of each of an impulse response waveform obtained from the A/D converter 21 and an impulse response waveform obtained from the A/D converter 22 was obtained.

Figure 8:
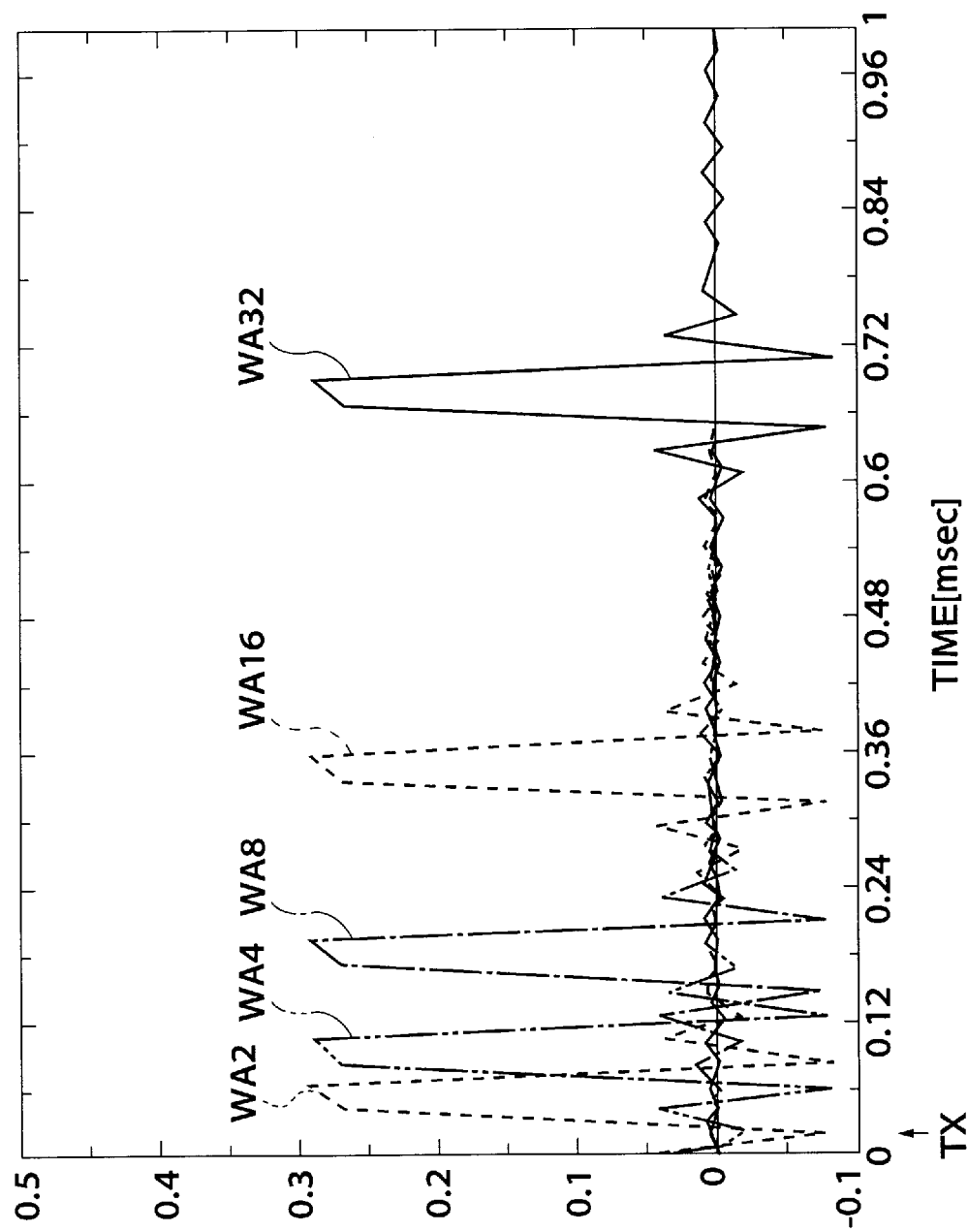
FIG. 8 is a view showing impulse response waveforms that are taken from the floating type A/D converter of FIG. 7, in order to yield the effect of the present embodiment.
Figure 9:
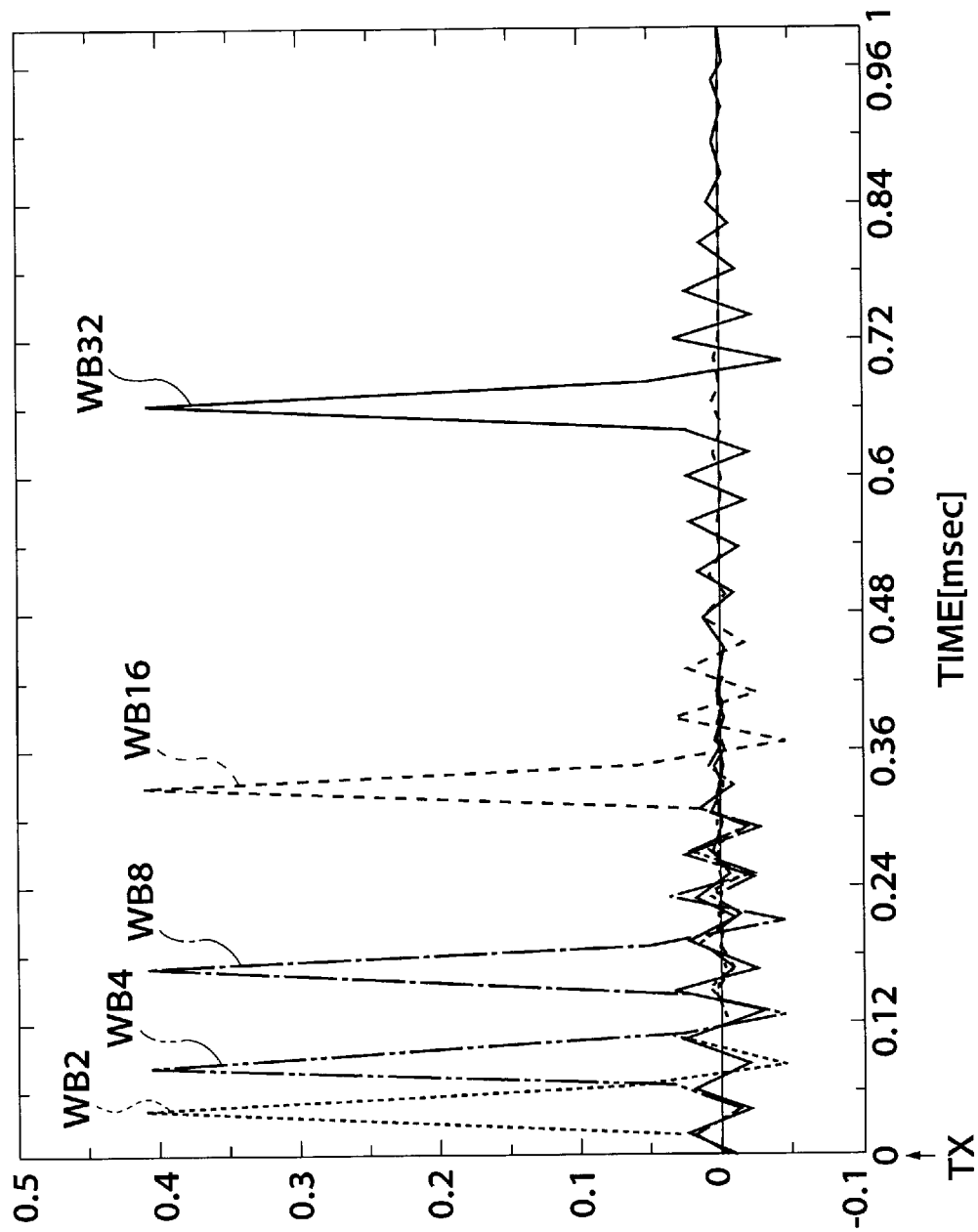
FIG. 9 is a view showing impulse response waveforms that are taken from the floating type A/D converter of FIG. 7, in order to yield the effect of the present embodiment.

Then, some types of waveforms were prepared by shifting each of the impulse response waveforms along the time axis, using the sample data of each impulse response waveform. In FIG. 8, waveforms WA2, WA4, WA8, WA16 and WA32 were obtained by delaying the impulse response waveform received from the A/D converter 21, by a time length of 2 samples, 4 samples, 8 samples, 16 samples, and 32 samples, respectively. In FIG. 9, waveforms WB2. WB4, WB8, WB16 and WB32 are obtained by delaying the impulse response waveform received from the A/D converter 22, by a time length of 2 samples, 4 samples, 8 samples, 16 samples, and 32 samples, respectively. These waveforms respectively correspond to impulse waveforms that are supplied from each delay element to the switching device 5 when the delay time of the delay elements 61 and 62 is changed by 2 sampling periods to 32 sampling periods.

Then, the frequency characteristics of the floating type A/D converter were obtained in the case where respective impulse response waveforms generated from the switching device 5 by synthesizing corresponding impulse response waveforms from the A/D converter 21 and A/D converter 22) were obtained, and the delay time of the delay elements 61 and 62 was changed by applying FFT (fast Fourier transform) to sample data of these impulse response waveforms. This operation will be described below in greater detail.

Initially, a portion of the impulse response waveform WA2 that precedes the switching timing TX of the switching device 5 was cut out, and a portion of the impulse response waveform WB2 that follows the switching timing TX was cut out. Next, the level of the waveform cut out from the impulse response waveform WA2 was reduced to 1/A, and the resulting waveform was connected to the waveform cut out from the impulse response waveform WB2, so as to obtain an impulse response waveform that would be generated from the switching device 5 where the delay time of the delay elements 61 and 62 was made equal to 2 sampling periods. Then, sample data of the impulse response waveform thus obtained was processed according to FET, so as to obtain the frequency characteristic of the floating type A/D converter where the delay time of the delay elements 61 and 62 was equal to 2 sampling periods.

Similar operations were performed using the impulse response waveforms WA4 and WB4, WA8 and WB8, WA16 and WB16, and WA32 and WB32.

Figure 10:
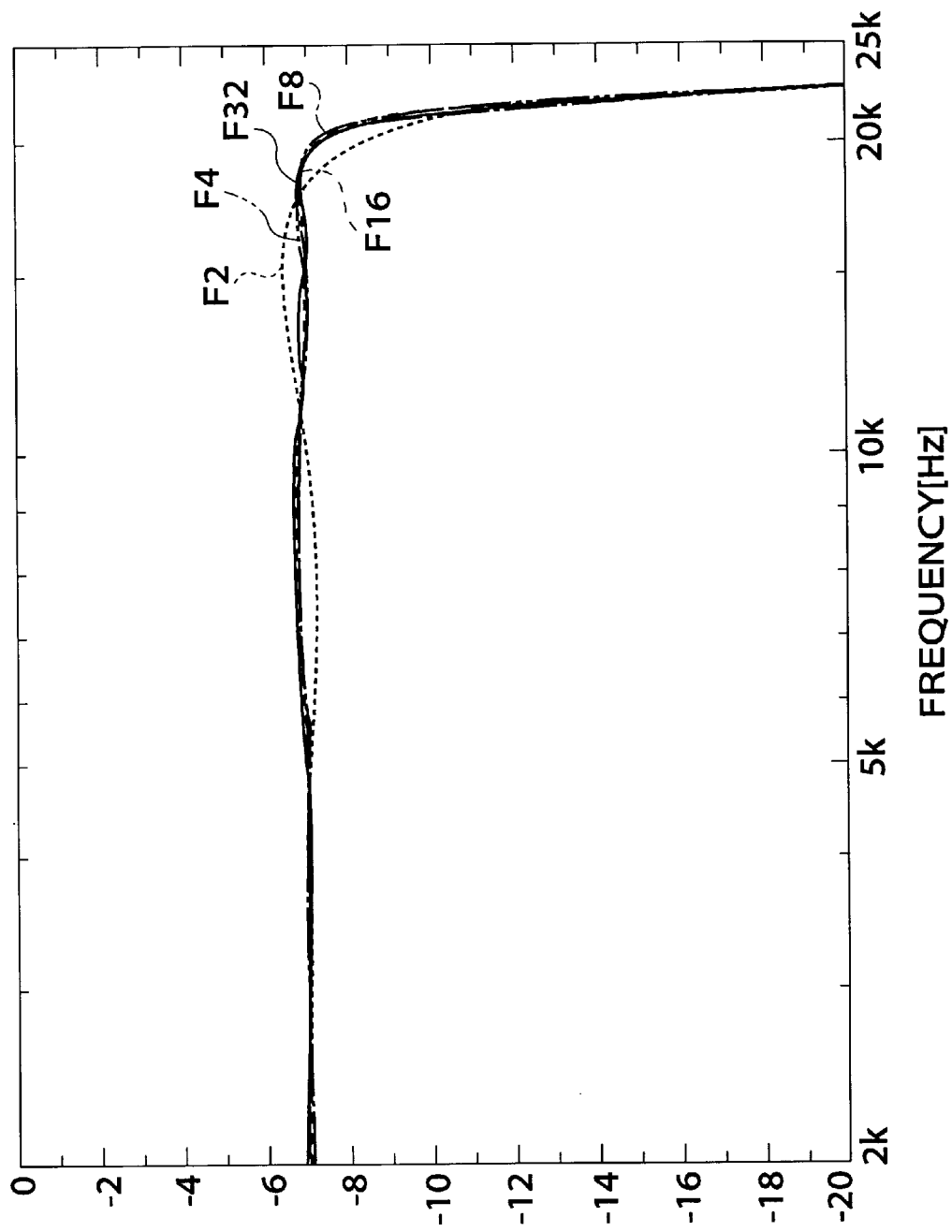
FIG. 10 is a view showing frequency characteristics of the floating type A/D converter of FIG. 7, which are obtained by applying FFT to waveforms that are synthesized from the impulse response waveforms of FIG. 8 and FIG. 9.

FIG. 10 shows results obtained in this manner. In FIG. 10, F2, F4, F8, F16 and F32 indicate the frequency characteristics of the floating type A/D converter where the delay time of the delay elements 61 and 62 was changed from 2 sampling periods to 32 sampling periods, respectively. It will be understood from FIG. 10 that the stability in the frequency characteristic of the floating type A/D converter is improved as the delay time of the delay elements 61 and 62 is increased. Thus, a sufficiently stable frequency characteristic can be achieved if the delay time of the delay elements 61 and 62 is substantially equivalent to 32 sampling periods.

The decimation filter of each of the A/D converters 21, 22 used in this experiment is a FIR filter that uses 64 delay elements each delaying a signal by only one sampling period, and hence has a delay time equivalent to 32 sampling periods. Thus, the time it takes the A/D converter 21 to generate a pre-echo is supposed to be equal to about 32 sampling periods. Accordingly, if the delay time of the delay elements 61 and 62 is controlled to be equal to or longer than 32 sampling periods, an impulse response waveform containing symmetric pre-echo and post-echo can be theoretically obtained, and the floating type A/D converter provides a sufficiently stable frequency characteristic.

The experiment as described above revealed that the frequency characteristic of the floating type A/D converter is stabilized if the delay time of the delay elements 61 and 62 is controlled to be equivalent to 32 sampling periods, and this result agrees with the above-described theoretical assumption.

As explained above, it was experimentally confirmed that the floating type A/D converter of the present embodiment is able to provide an impulse response waveform containing symmetric pre-echo and post-echo, thereby assuring a stable frequency characteristic.

In the present embodiment, the switches 71 and 81, and switches 72 and 82 may be switched from the state as shown in FIG. 7, to another state in which the pairs of switches are respectively connected to bypass lines 83, 84, so that the digital signals generated from the DSP 3 and A/D converter 22 are respectively supplied to the switching device 4, without passing through the delay elements 61, 62.

In this case, the floating type A/D converter of this embodiment performs the same operation as the conventional counterpart, and therefore shows an unstable frequency characteristic in a high frequency region. However, the A/D converter in this operating state has the advantage of improved response since it does not use the delay elements 61, 62.

By placing the switches 71 and 81 and switches 72 and 82 in a selected one of the above operating states, the A/D converter of the present embodiment is advantageously able to perform A/D conversion with a stable frequency characteristic, due to the use of the delaying elements 61, 62, and also perform A/D conversion with excellent response, without using the delaying elements 61, 62.

While the floating type A/D converter including two A/D converters has been described in the illustrated embodiment, it is to be understood that the present invention may be applied to floating type A/D converters using three or more A/D converters.

Figure 11:
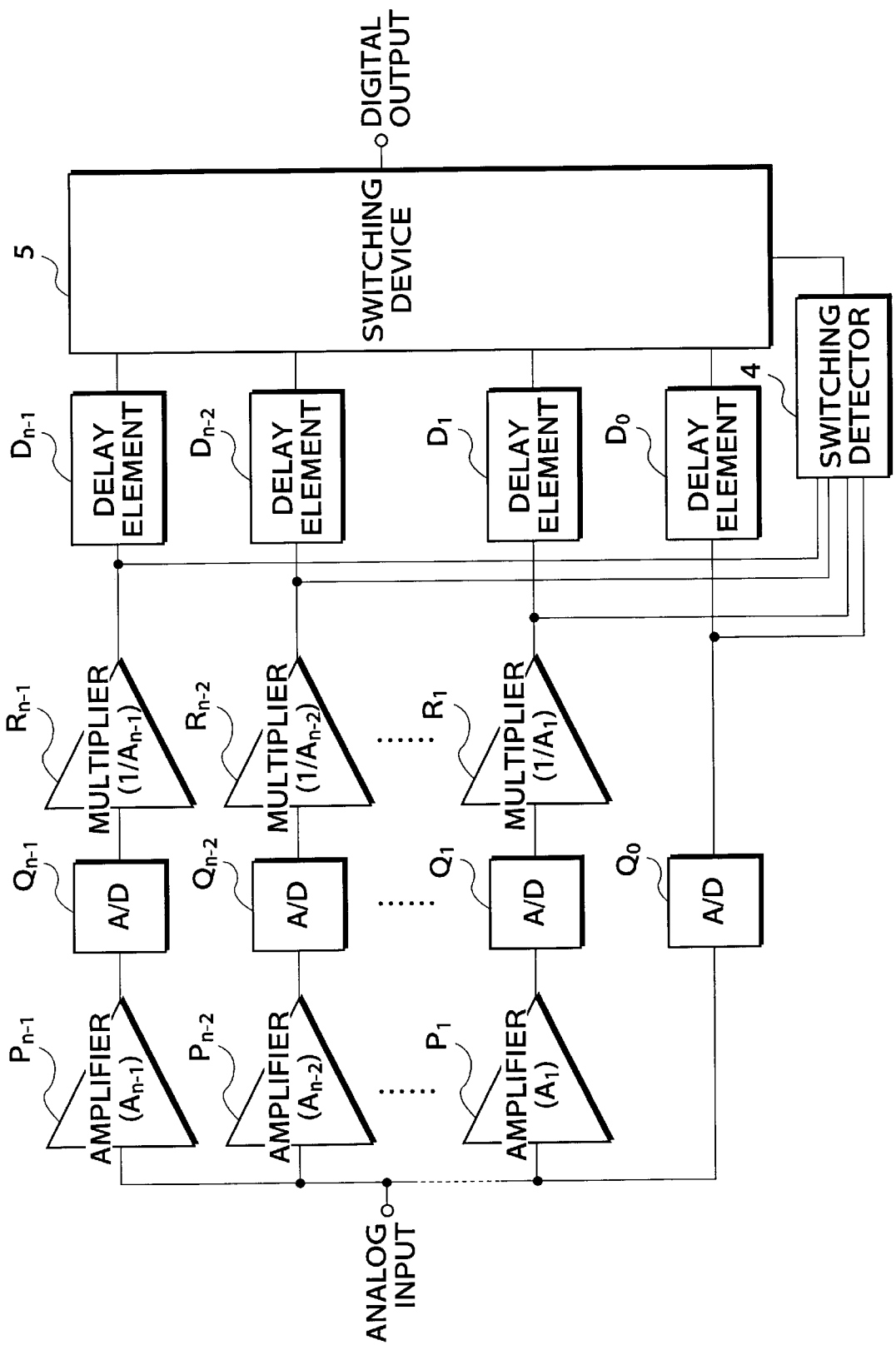
FIG. 11 is a block diagram showing the construction of a floating type A/D converter according to another embodiment of the present invention.

FIG. 11 shows an example of floating type A/D converter according to another embodiment of the present invention, in which n pieces of A/D converters are used. In FIG. 11, P1 through Pn−1 denote amplifiers having different gains A1 to An−1 (1<A1<A2< . . . <An−1), and Q0 through Qn−1 denote A/D converters each consisting of a $\Delta\Sigma$ modulator and a decimation filter, while R1 through Rn−1 denote multipliers for multiplying each input signal by a corresponding one of gains 1/A1 to 1/An−1, and D0 through Dn−1 denote delay elements having the same delay time as the decimation filters. The switching detector 4 and switching device 5 have the same functions as those as shown in FIG. 7. In this floating type A/D converter, while the output signal of the multiplier Rn−1 is not being clipped, a digital signal obtained by delaying an output signal of the multiplier Rn−1 with the delaying element Dn−1 is generated from the switching device 5. If the level of an analog signal to be converted is increased, and the output signal of the multiplier Rn−1 is clipped, an output signal of the delay element Dn−2, instead of the delay element Dn−1, is selected by the switching device 5. If the output signal of the multiplier Rn−2 is clipped, an output signal of the delay element Dn−3 is selected by the switching device 5. In this manner, a suitable one of the delay elements is selected by the switching device 5, depending upon the clipping state of the output signal of each multiplier. This floating type A/D converter also provides a stable frequency characteristic, due to the use of the delay elements that fulfill the same function as those of the previous embodiment.

While the A/D converters each consisting of $\Delta\Sigma$ modulator and decimation filter are used in the floating type A/D converter of the embodiments described above, the present invention is not limited to the use of such A/D converters, but may be applied to various floating type A/D converters each comprising a plurality of A/D converters each of which includes a filter of large delay time. In this case, too, the resulting A/D converter yields substantially the same effect as provided in the illustrated embodiments. While the floating type A/D converter provides a desired effect if the delay time of each delay element is equivalent to the delay time of the corresponding decimation filter in the illustrated embodiments, the delay time of the delay elements may be suitably determined in view of various conditions, such as a desired response speed.

It is also to be understood that the present invention is not limited to the illustrated embodiments, but may be otherwise embodied with various changes or modifications, without departing from the scope of the invention.

What is claimed is:

1. A floating type analog-to-digital converter comprising:
    an analog signal level adjusting device that adjusts a level of an analog signal with a plurality of different first gains, so as to generate a plurality of analog signals of different levels for analog-to-digital conversion;
    a plurality of analog-to-digital converters that convert respective ones of said plurality of analog signals generated from said analog signal level adjusting device into respective digital signals, and output the digital signals;
    a digital signal level adjusting device that adjusts levels of the digital signals with a plurality of different second gains corresponding to respective inverses of said plurality of first gains, and outputs adjusted digital signals;
    a delay device that delays the digital signals generated from said digital signal level adjusting device, and outputs delayed digital signals; and
    a switching device that selects one of the digital signals generated from said delay device, based on a level of one digital signal selected from the digital signals generated from said plurality of analog-to-digital converters, and outputs the selected one digital signal,
    wherein an impulse response waveform, that occurs in the floating type analog-to-digital converter when an impulse is applied thereto, has a form in which symmetric pre-echo and post-echo are added to leading and trailing ends, respectively.

2. A floating type analog-to-digital converter according to claim 1, wherein each of said plurality of analog-to-digital converters comprises a filter having a delay time, and wherein said delay device delays each of the digital signals generated from said digital signal level adjusting device by at least a time period which is equivalent to the delay time of the filter of a corresponding one of said analog-to-digital converters.

3. A floating type analog-to-digital converter according to claim 1, wherein said switching device selects said one of the digital signals generated from said delay device, depending upon whether said one digital signal selected from the digital signals generated from said plurality of analog-to-digital converters is clipped.

4. A floating type analog-to-digital converter according to claim 1, wherein each of said plurality of analog-to-digital converters comprises a ΔΣ modulator and a decimation filter having a delay time, and wherein said delay device delays each of the digital signals generated from said digital signal level adjusting device by at least a time period which is equivalent to the delay time of the decimation filter of a corresponding one of said analog-to-digital converters.

5. A floating type analog-to-digital converter according to claim 1, further comprising a bypass device that bypasses said delay device, and supplies the digital signals generated from said digital signal level adjusting device to said switching device without passing through said delay device.

6. A floating type analog-to-digital converter according to claim 1, wherein said digital signal level adjusting device comprises at least one digital signal processing device.

7. A floating type analog-to-digital converter according to claim 1, wherein said digital signal level adjusting device comprises at least one multiplier.

8. A floating type analog-to-digital converter comprising:
an analog signal level adjusting device that adjusts a level of an analog signal with a plurality of different first gains, so as to generate a plurality of analog signals of different levels for analog-to-digital conversion;
a plurality of analog-to-digital converters that convert respective ones of said plurality of analog signals generated from said analog signal level adjusting device into respective digital signals, and output the digital signals;
a digital signal level adjusting device that adjusts levels of the digital signals with a plurality of different second gains corresponding to respective inverses of said plurality of first gains, and outputs adjusted digital signals;
a delay device that delays the digital signals generated from said digital signal level adjusting device, and outputs delayed digital signals; and
a switching device that selects one of the digital signals generated from said delay device, based upon whether one digital signal selected from the digital signals generated from said plurality of analog-to-digital converters is clipped, and outputs the selected one digital signal,
wherein digital signals which are supplied from said delay device to said switching device at a switching time of said switching device are output digital signals of said plurality of analog-to-digital converters generated at a time which is prior to the switching time by a delay time of said delay device.

9. A floating type analog-to-digital converter comprising:
an analog signal level adjusting device that adjusts a level of an analog signal with a plurality of different first gains, so as to generate a plurality of analog signals of different levels for analog-to-digital conversion;
a plurality of analog-to-digital converters that convert respective ones of said plurality of analog signals generated from said analog signal level adjusting device into respective digital signals, and output the digital signals;
a digital signal level adjusting device that adjusts levels of the digital signals with a plurality of different second gains corresponding to respective inverses of said plurality of first gains, and outputs adjusted digital signals;
a delay device that delays the digital signals generated from said digital signal level adjusting device, and outputs delayed digital signals;
a switching detector that detects whether one digital signal selected from the digital signals generated from said plurality of analog-to-digital converters is clipped, and generates an output signal indicative of a detection result, said switching detector having an input thereof connected to an output of said digital signal level adjusting device at a location before an input of said delay device; and
a switching device that selects one of the digital signals generated from said delay device, according to the output signal generated from said switching detector, and outputs the selected one digital signal,
wherein digital signals which are supplied from said delay device to said switching device at a switching time of said switching device are output digital signals of said plurality of analog-to-digital converters generated at a time which is prior to the switching time by a delay time of said delay device.

\* \* \* \* \*